United States Patent [19]
Wördenweber

[11] Patent Number: 5,620,576
[45] Date of Patent: Apr. 15, 1997

[54] METHOD OF AND APPARATUS FOR PRODUCING A THIN LAYER OF A MATERIAL ON A SUBSTRATE

[75] Inventor: Roger Wördenweber, Niederzier, Germany

[73] Assignee: Forschungszentrum Julich GmbH, Julich, Germany

[21] Appl. No.: 683,905

[22] Filed: Jul. 19, 1996

Related U.S. Application Data

[63] Continuation of Ser. No. 514,834, Aug. 14, 1995, abandoned, which is a continuation of Ser. No. 102,696, Aug. 5, 1993, abandoned, which is a division of Ser. No. 848,828, Mar. 10, 1992, Pat. No. 5,290,758.

[30] Foreign Application Priority Data

Mar. 13, 1991 [DE] Germany ............................ 41 080 01.7

[51] Int. Cl.⁶ ................................................ C23C 14/34
[52] U.S. Cl. ................................ 204/298.07; 204/298.09; 204/298.11; 204/298.12; 204/298.15; 204/298.26
[58] Field of Search ........................ 204/298.03, 298.05, 204/298.06, 298.07, 298.09, 298.11, 298.15, 298.12, 298.25, 298.26, 298.18, 192.24; 505/731, 475, 476, 473, 470

[56] References Cited

U.S. PATENT DOCUMENTS

| | | | |
|---|---|---|---|
| 4,049,533 | 9/1977 | Golyanov et al. | 209/298.09 |
| 4,094,764 | 6/1978 | Boucher et al. | 204/298.07 |
| 4,362,936 | 12/1982 | Hofmann et al. | 204/208.03 |
| 4,902,671 | 2/1990 | Koinuma e tal. | 505/475 |
| 4,933,063 | 6/1990 | Katsura et al. | 204/298.09 |
| 4,950,642 | 8/1990 | Okamoto et al. | 505/730 |
| 4,975,168 | 12/1990 | Ohno et al. | 204/298.07 |
| 5,110,435 | 5/1992 | Haberland | 204/298.05 |
| 5,441,623 | 8/1995 | Lin | 505/475 |

*Primary Examiner*—Nam Nguyen
*Assistant Examiner*—Rodney G. McDonald
*Attorney, Agent, or Firm*—Herbert Dubno

[57] ABSTRACT

Coatings on substrates which incorporate reactive gases like oxygen and nitrogen are formed by providing the substrate so that it is spaced from the target region in a coating chamber, forming particles of the coating material by plasma from a cathodic target and entraining the particles to the substrate spaced from the plasma in a gas stream including the reactive gas and at a pressure of 0.1 to 20 mbar.

3 Claims, 1 Drawing Sheet

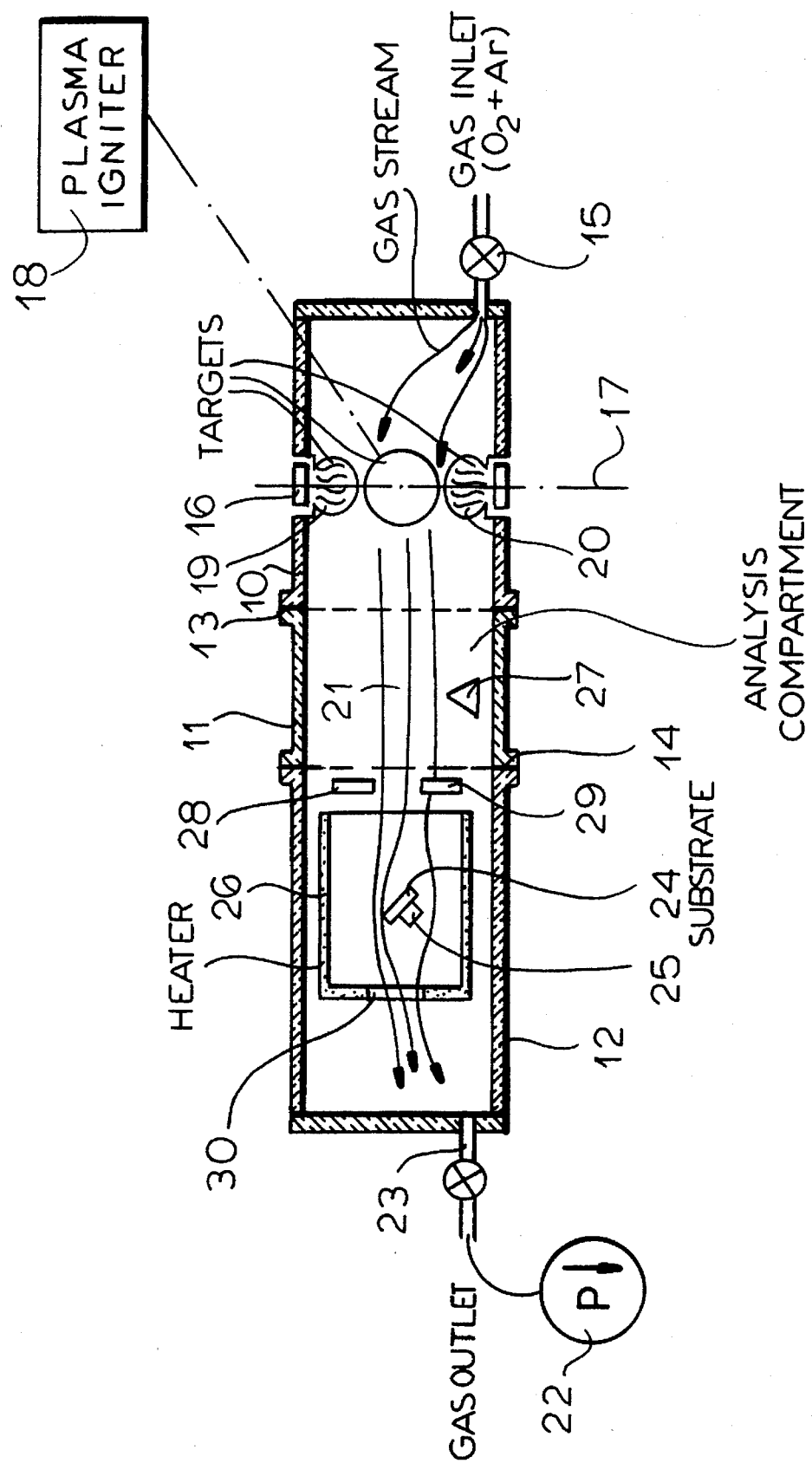

METHOD OF AND APPARATUS FOR PRODUCING A THIN LAYER OF A MATERIAL ON A SUBSTRATE

CROSS REFERENCE TO RELATED APPLICATION

This is a file-wrapper continuation of copending application Ser. No. 08/514,834, filed Aug. 14, 1995, now abandoned which is a continuation of application Ser. No. 08/102,696 now abandoned which is a divisional of application Ser. No. 07/848,828 filed Mar. 10, 1988, now U.S. Pat. No. 5,290,758.

FIELD OF THE INVENTION

My present invention relates to a method of and an apparatus for producing thin layers of a material on a substrate and, more particularly, to a method of and an apparatus for producing thin layers of materials which contain oxygen or other reactive components, especially gases, at comparatively high levels, for example the material of an oxidic high-temperature superconductor.

BACKGROUND OF THE INVENTION

A variety of techniques have been developed for producing thin superconductor layers on a substrate. In one of these techniques, the material is constituted as a target or cathode material and the target is subjected to cathodic sputtering, thereby transferring particles of the material onto a substrate disposed in the immediate region of the coating source. The substrate is usually heated.

In an apparatus for this purpose, a vacuum chamber can be provided with the sputtering source and immediately in the vicinity thereof the substrate is disposed so that there is a direct transfer of the sputtered material from the cathode to the substrate.

The class of materials with which the invention is applicable, namely those which contain oxygen, nitrogen or other reactive gases, include high-temperature superconductors, including the $YBa_2Cu_3O_{7-x}$, BiSrCaCuO or TlBaCaCuO types, where x is a fraction less than 1.

These compositions have a rather complex structure, referred to as a Perovskite structure and oxygen which is incorporated in situ therein.

A number of deposition techniques have been used to produce thin films of these materials, e.g. CVD, evaporation laser deposition and sputtering method. The preparation of uniform high quality films especially over large areas has been proven difficult due to certain limitations characteristic of each deposition technique. An important advantage of plasma sputtering over e.g. evaporation methods is among others given by the fact that this technique stoichiometric material as target material can be ablated in a very reproducible way at generally high reactive gas (i.e. oxygen) processes.

Earlier systems over which the present invention can be considered to be an improvement, are described, for example in X. X. Xi, G. Linker, O. Mayer, E. Nold, B. Obst, F. Ratzel, R. Smithey, B. Strehlau, F. Weschenfelder, and J. Geerk, Z. Phys. B 74 (1989), 13 or C. B. Eom, J. Z. Sun, K. Yamamoto, A. F. Marshall, K. E. Luther, T. H. Gaballe and S. S. Laderman, Appl. Phys. Lett. 55 (1989), P. 595. These techniques are referred to as "off axis" high pressure cathodic sputtering since the substrate is located with a spacing from the axis of the cathodic target.

A so-called back-sputter effect is described in L. R. Gilbert, R. Messier and S. V. Krishnaswamy, J. Vac. Sci. Technol. 17, (1980), according to which a coating deposited by conventional cathodic sputtering is removed partially by ions from the plasma.

This problem characterizes even off-axis high pressure cathodic sputtering as previously mentioned as well as other cathodic sputtering methods. In all of the earlier sputtering methods, moreover, undesirable and disadvantageous charge accumulation effects are observed.

OBJECTS OF THE INVENTION

It is, therefore, the principal object of the present invention to provide an improved method of producing a thin layer of a material containing a high level of an element contributed by a reactive gas, especially of the so-called 1, 2, 3 superconductor or another material in which the reactive gas is oxygen or nitrogen whereby the drawbacks of earlier systems are avoided.

Another object of this invention is to provide a cathodic deposition technique in which particles of a cathodic material are caused to pass into a plasma and from which these particles are deposited upon a substrate, whereby the back-sputtering effect in which ions of the plasma remove the layer which is produced in whole or in part can be avoided.

Still another object of the invention is to provide an improved apparatus for carrying out the method of the invention.

SUMMARY OF THE INVENTION

These objects are achieved, in accordance with the method aspect of the invention, by the steps of:
providing the material as a cathodic target material in at least one target spaced from a substrate to be provided with the thin layer;
generating a plasma at the target thereby cathodically ablating particles of the target material into the plasma;
entraining the particles in a stream of gas at a pressure of 0.1 to 20 mbar from a region of the target to the substrate; and
depositing the particles from the stream of gas on the substrate as the particles are entrained to the substrate from the region to form the thin layer.

The apparatus can comprise:
a gas-tight chamber;
at least one target composed of a cathodic target material adapted to be formed at the thin layer in the chamber;
means in the chamber at a region of the target for generating a plasma into which particles of the material pass from the target;
a heated substrate holder in the chamber spaced from the region; and
means for flowing a stream of gas from the region past the substrate whereby particles of the material are entrained in the stream onto the substrate to form the thin layer.

In other words, in the system of the invention, the particles released from the targets are deposited on the substrate at a location outside the range of the plasma which produces these particles at the cathode by entraining them in a gas stream at a pressure of 0.1 to 20 mbar to the target. An optimum pressure range for deposition of the 1-2-3 superconducting material is 0.5 to 10 mbar.

The process of the invention has a number of advantages:

(a) The process of the invention avoids detrimental effects of the plasma formed at the target upon the layer developing on the substrate. This includes an ablation effect in which the deposit of, for example, $YBa_2Cu_3O_{7-x}$ (where x is less than 1) or the so-called 1-2-3 superconducting material, might be reablated by bombardment of oxygen ions and electrons from the plasma. Charge-accumulation effects and heating of the layer from the plasma are also avoided.

(b) By comparison with the chemical vapor deposition (CVD) process, which also operates with a spatial separation between source and the substrate and with a particle transport by means of a gas stream, the process of the invention has the advantage that the particles which are to be deposited in the layer are obtained in a substantially simpler manner and require a simpler environment for formation and delivery on the substrate. In the case of CVD of $YBa_2Cu_3O_{7-x}$, the growth rate (layer thickness development per unit time) and the deposition rate of different elements are difficult to stabilize and carrier substances are not necessary. In the case of CVD, for example, carbon can be incorporated in the layer and may be undesirable. Furthermore, the CVD process is more complicated.

(c) Because of the spatial separation of the source and its plasma and the substrate, in situ analysis of the gas stream and correction e.g. of the composition of the entrained particles and, therefore, the stoichiometry of the resulting layer can be effected. In a chamber between the plasma region and the substrate, for example, by a sensor or by spectral analysis, the gas stream can be analyzed, the composition of the particles determined and the composition of the layer predicted so that appropriate correction can be carried out. While such analysis is also possible in CVD processes, the measurements are usually skewed by the presence of carrier material.

In apparatus terms, it is desirable that the substrate holder be spaced laterally of a surface normal to the target and preferably all of the targets when a plurality of targets are provided in a star-shaped array, by at least 1½ times the surface extent of the target in the direction of the substrate holder. The cathodes, the substrate holder, the gas feed line and a suction opening for drawing the gas off past the substrate, are so arranged that, in operation of the device, the gas stream will travel from the cathode or the region of the plasma in the vicinity of the cathode to the substrate holder.

When a plurality of targets are used in a star-shaped array, it is possible to compose the coating which is formed a number of different materials each preferentially sputtered from one of the targets.

According to another feature of the invention, gas guide means such as baffles, can be provided to direct and orient the gas stream.

According to still another feature of the invention, between the plasma region of the apparatus and the substrate in the gas-tight chamber of the apparatus which may be elongated in the direction of gas flow, an analysis region is provided as an additional compartment in which analysis of the particles entrained in the gas stream can be carried out.

BRIEF DESCRIPTION OF THE DRAWING

The above and other objects, features and advantages of the present invention will become more readily apparent from the following description, reference being made to the accompanying drawing, the sole FIGURE of which is a diagrammatic cross sectional view through a coating chamber according to the invention.

SPECIFIC DESCRIPTION

The coating chamber shown diagrammatically in the drawing comprises three housing sections 10, 11 and 12 defining respective compartments and flanged together at 13 and 14 to form a gas-tight chamber.

In the target compartment 10, which is formed with a gas inlet 15 supplied, for example, with oxygen as the reactive gas and argon, three circular targets 16 are shown to represent a star-shaped array of such targets with radial surface normals, only one of which has been shown at 17 in the drawing. The surface normals lie perpendicular, therefore, to the axis of the coating chamber shown in the drawing. Any suitable means represented by the plasma igniter 18 can be provided for generating a plasma in the region of each target, the plasmas being represented at 19 and 20 in the drawing, thereby removing particles of the target material into the plasma for entrainment in the gas stream 21 which is caused to flow through the chamber by a pump 22 connected at an outlet 23 at the substrate compartment 12 of the chamber. The pump 22 maintains a gas pressure of the stream of gas of 0.1 to 20 mbar and preferably 0.5 to 10 mbar.

The target materials, of course, correspond to the elements to be deposited on the substrate and are either the elements themselves or alloys thereof.

The amount of material removed from each target depends on the plasma parameters.

At the pressure range of 0.1 to 20 mbar, the free path of the particles is about 2 to 200 μm. At a pressure between 0.5 to 10 mbar, the free path is about 10 to 100 μm. This free path suffices to enable the gas to entrain the particles to the substrate 24 which is mounted upon a substrate holder 25 within the heating sleeve 26 provided with an outlet window 27. The heating sleeve 26 serves to heat the substrate to the desired temperature. The compartment 11 is an analysis chamber and is provided with means represented diagrammatically only at 30' providing a compositional analysis of the particles in the gas stream. The means 27' can be a sensor or other device capable of analyzing the particles by analysis of an energy spectrum, for instance upon X-ray activation.

The element specific quantitative determination can be fed back to the respective plasma generators to control the quantities of the respective particles contributed by the cathodes and thus enable the stoichiometry of the coating to be controlled and corrected. In the embodiment illustrated in the drawing, one or more cathodes can individually contribute preferentially yttrium, barium and copper to provide a coating with $YBa_2Cu_3O_{7-x}$ composition, oxygen being obtained from the gas stream and/or from deposition of an oxide of one of the other elements.

The deposition of coatings with more components $Bi_2Sr_2Ca_2Cu_3O_y$ or $Tl_2Sr_2Ca_2Cu_3O_y$, where y is a number such that the respective compound is a superconductor, is also advantageous.

The deposition compartment 12 can receive a plurality of substrates disposed in the path of the gas stream. Especially for large-area coatings and for certain compositions like $YBa_2Cu_3O_{7-x}$, a careful control of the temperature of the substrate is important. Naturally, careful temperature control of the temperature of the substrate in planar cathodic sputtering in the region of the plasma is extremely difficult to achieve. With the heating jacket 26, wherein the substrate can be practically surrounded with a cylindrical heater, it is possible to achieve better temperature definition at the substrate.

The deposition of material on the walls of the housing can be controlled by providing baffles or the like at 28 and 29 along the path of the gas stream. Such baffles can be used to direct the gas stream and also control the heating up of the walls.

By comparison with other thin-layer deposition processes:

1. Planar high-pressure cathodic sputtering:

This process has the serious drawback that the substrate is placed within the plasma or so close to it that a coating removal effect is observed with or without chemical change in the remaining coating and with or without detrimental heating. A direct and definitive analysis of the composition of the coating is not possible. Neither drawback is present in the system of the invention.

2. Off-axis cathodic sputtering:

This method, which has been used effectively in the past for the production of high-temperature superconductors, nevertheless gives rise to smaller homogeneity regions which is a drawback. An in situ analysis of the composition of the above-given kind is not possible. Cathodic sputtering from a plurality of targets and thus a correction of the composition is not possible. This poses a problem where the composition of the film will not conform to a target composition or a composition as required in the film cannot be made into an effective target.

3. Hollow-cavity sputtering:

The drawbacks are analogous to those given at 2.

4. Vapor Deposition:

Most vapor deposition processes operate with much lower pressures. The incorporation of sufficient oxygen for, for example $YBa_2Cu_3O_{7-x}$, is extremely difficult. This drawback does not always characterize laser ablation. In vapor deposition frequently large particles are ablated which can lead to poor quality of the deposit.

In general, therefore, the process of the invention provides substantial advantages over these prior art processes.

I claim:

1. An apparatus for producing a layer of a material containing an element contributed by a reactive gas, comprising:

(a) an elongated, gas-tight chamber, (b) a target compartment within said chamber comprising, a gas inlet opening into said chamber at a location at one end of said chamber at an upstream end of the target compartment with respect to a direction of gas flow through said chamber, at least one target, composed of a cathodic target material to be incorporated in said layer of a material, an open downstream side opposite the gas inlet opening, and means within said target compartment for generating a plasma at said target into which particles of said material pass from said target and in which said particles pass in an uninterrupted flow to the open downstream side of the target compartment;

(c) a substrate compartment within said chamber longitudinally spaced from said open downstream side of said target compartment and having an open upstream side and a downstream side with respect to said direction of gas flow, said substrate compartment comprising:

a gas outlet in a downstream end of the substrate compartment so that said inlet and said outlet communicate with said chamber at opposite ends of said chamber, an elongated heating jacket located entirely within said substrate compartment with one end of said elongated heating jacket open and spaced downstream from the upstream side of the substrate compartment and the other end of said elongated heating jacket spaced further downstream from the upstream side of the substrate compartment, said other end of said heating jacket provided with an open outlet window, said heating jacket within said substrate compartment forming a substantially unobstructed gas flow path from said one end of said heating jacket to said open outlet window in said heating jacket, said gas passing in an unobstructed gas flow path from said window to said gas outlet, a substrate holder surrounded by said heating jacket within said substrate chamber and spaced from a surface normal to said target in the target compartment, said surface normal being transverse to said flow direction, and a baffle means within said substrate compartment at the open upstream side of the substrate compartment and upstream of said elongated heating jacket in said direction for guiding said stream of gas from the open downstream side of the target compartment to the open end of the elongated heating jacket in said substrate compartment to thereafter provide a substantially uninterrupted gas flow path through the heating jacket in the direction of and past said substrate holder to the other end of said heating jacket and through the outlet window; and (d) a pump connected to said gas outlet communicating with said substrate compartment for maintaining a pressure of substantially 0.1 to 20 mbar in said chamber and for flowing a free-flowing stream of gas in said direction from said inlet, through said target compartment to said substrate compartment along said substrate holder and through the open outlet window in the heating jacket to said outlet whereby said particles are entrained in said stream onto a substrate on said substrate holder to form said layer.

2. The apparatus defined in claim 1 wherein a plurality of said targets are provided in said target compartment in a shape of a star.

3. The apparatus defined in claim 1, further comprising an analysis compartment formed in said chamber between said target compartment and said substrate compartment for enabling analysis of the stream of gas flowing from the target compartment to the substrate compartment.

* * * * *